United States Patent
Friedman et al.

(10) Patent No.: US 6,239,703 B1
(45) Date of Patent: May 29, 2001

(54) COMMUNICATION PAD STRUCTURE FOR SEMICONDUCTOR DEVICES

(75) Inventors: Daniel J. Friedman, Tarrytown; Paul A. Moskowitz, Yorktown Heights; Michael J. Brady, Brewster; Dah-Weih Duan, Yorktown Heights; Harley K. Heinrich, Brewster, all of NY (US)

(73) Assignee: Intermec IP Corp, Wilmington, DE (US)

( * ) Notice: Subject to any disclaimer, the term of this patent is extended or adjusted under 35 U.S.C. 154(b) by 0 days.

(21) Appl. No.: 09/300,968

(22) Filed: Apr. 28, 1999

Related U.S. Application Data

(63) Continuation-in-part of application No. 09/225,846, filed on Jan. 2, 1999, now abandoned.
(60) Provisional application No. 60/070,336, filed on Jan. 2, 1998, and provisional application No. 60/070,350, filed on Jan. 2, 1998.

(51) Int. Cl.$^7$ .................................................. G08B 13/41
(52) U.S. Cl. .................................... 340/572.7; 340/572.5; 340/571; 340/568.1; 340/572.1; 340/825.34
(58) Field of Search .............................. 340/572.7, 572.5, 340/571, 568.1, 572.1, 825.34

(56) References Cited

U.S. PATENT DOCUMENTS

| 5,554,974 | * | 9/1996 | Brady et al. | 340/572 |
| 5,751,256 | * | 5/1998 | McDonough et al. | 343/873 |
| 5,854,480 | * | 12/1998 | Noto | 235/492 |

* cited by examiner

Primary Examiner—Daniel J. Wu
Assistant Examiner—Tai T. Nguyen
(74) Attorney, Agent, or Firm—Rodney T. Hodgson

(57) ABSTRACT

A bonding pad for a semiconductor device is provided with a mechanical supportive structure substantially surrounding the pad. The mechanical supportive structure prevents cracking of passivation material over the pad when a lead is compression bonded to the pad.

21 Claims, 3 Drawing Sheets

COMMUNICATION PAD STRUCTURE FOR SEMICONDUCTOR DEVICES

CROSS-REFERENCE TO RELATED APPLICATIONS

The present application is a continuation in part of application Ser. No. 09/225,846 by Heinrich et al., filed Jan. 2, 1999 now abandoned, which claims the benefit of Provisional Applications No. 60/070,336 filed Jan. 2, 1998, and Ser. No. 60/070,350 filed Jan. 2, 1998. The above identified non provisional and provisional applications are hereby incorporated herein by reference in their entireties including drawings and appendices.

FIELD OF THE INVENTION

The field of the invention is the field of connections to devices on semiconductor substrates. In particular, the field is the field of compression bonding of electrically conducting wires to connection pads on an integrated circuit chip. More particularly, the field is the connection of radio frequency (RF) connections to integrated circuit chips, and most particularly, the field of connection of RF antennas to RF identification transponders (RFID tags).

BACKGROUND OF THE INVENTION

RF Tags can be used in a multiplicity of ways for locating and identifying accompanying objects, items, animals, and people, whether these objects, items, animals, and people are stationary or mobile, and transmitting information about the state of the of the objects, items, animals, and people. It has been known since the early 60's in U.S. Pat. No. 3,098,971 by R. M. Richardson, that electronic components on a transponder could be powered by radio frequency (RF) power sent by a "base station" at a carrier frequency and received by an antenna on the tag. The signal picked up by the tag antenna induces an alternating current in the antenna which can be rectified by an RF diode and the rectified current can be used for a power supply for the electronic components. The tag antenna loading is changed by something that was to be measured, for example a microphone resistance in the cited patent. The oscillating current induced in the tag antenna from the incoming RF energy would thus be changed, and the change in the oscillating current led to a change in the RF power radiated from the tag antenna. This change in the radiated power from the tag antenna could be picked up by the base station antenna and thus the microphone would in effect broadcast power without itself having a self contained power supply. In the cited patent, the antenna current also oscillates at a harmonic of the carrier frequency because the diode current contains a doubled frequency component, and this frequency can be picked up and sorted out from the carrier frequency much more easily than if it were merely reflected. Since this type of tag carries no power supply of its own, it is called a "passive" tag to distinguish it from an active tag containing a battery. The battery supplies energy to run the active tag electronics, but not to broadcast the information from the tag antenna. An active tag also changes the loading on the tag antenna for the purpose of transmitting information to the base station.

The "rebroadcast" or "reflection" of the incoming RF energy at the carrier frequency is conventionally called "back scattering", even though the tag broadcasts the energy in a pattern determined solely by the tag antenna and most of the energy may not be directed "back" to the transmitting antenna.

Prior art tags have used electronic logic and memory circuits and receiver circuits and modulator circuits for receiving information from the base station and for sending information from the tag to the base station.

The continuing march of semiconductor technology to smaller, faster, and less power hungry has allowed enormous increases of function and enormous drop of cost of such tags. Presently available research and development technology will also allow new function and different products in communications technology.

One fundamental problem with passive tags is that the range is limited by the voltage picked up by the tag antenna and rectified by the tag power conditioning circuits. The voltage must be high enough to run the tag electronics, and the voltage is generally the limiting factor in determining the distance from the base station antenna at which the tags may be used. Even active tags having a battery to run the tag electronics are limited in the voltage picked up by the tag antenna. The antenna design, and the connection of the antenna to the RFID front end electronics, is critical in producing the voltage and the power needed to run the tag electronics. The pads on the semiconductor chip needed to connect the semiconductor chip or chips to the antenna wires have heretofore had dimensions necessary to mechanically support the bonded wires or the "bumps" on the chip to which the antenna wires were bonded. Large pads lead to high input capacitance. When the pad sizes were reduced to reduce the capacitance, it was found that the passivation material over the edges of the pad cracked when the pad was bonded to wires by well known thermal compression bonding, ultrasonic bonding, or laser bonding. It is probable that the passivation material would also crack under solder reflow, such as is used in "flip chip" bonding, and that the method of the invention would also be of value in soldering to the pad. The following application teaches a method and an apparatus to solve the cracking problem and reduce the input capacitance for RF signals. This is particularly valuable when the input is brought in from an RF antenna, since it is easier to tune the antenna for the lower capacitance.

The statement headed "The Problem" at the first page and the first two paragraphs on the second page of incorporated application Ser. No. 60/070,336 are referenced for a background explanation.

RELATED PATENTS AND APPLICATIONS

Related U.S. Patents assigned to the assignee of the present invention include: U.S. Pat. Nos. 5,521,601; 5,528,222; 5,538,803; 5,550.547; 5,552,778; 5,554,974; 5,563,583; 5,565,847; 5,606,323; 5,635,693; 5,673,037; 5,680,106;5,682,143; 5,729,201; 5,729,697;5,736,929; 5,739,754; 5,767,789; 5,777,561; 5,786,626; 5,812,065; and 5,821,859. U.S. Patent applications assigned to the assignee of the present invention include: application Ser. No. 08/626,820, filed: Apr. 3, 1996, entitled "Method of Transporting RF Power to Energize Radio Frequency Transponders", by Heinrich, Zai, et al.; application Ser. No. 08/694,606 filed Aug. 9, 1996 entitled RFID System with Write Broadcast Capability by Cesar et al. ; application Ser. No. 08/681,741 filed Jul. 29, 1996 entitled RFID Transponder with Electronic Circuitry Enabling and Disabling Capability, by Heinrich, Goldman et al.; and application Ser. No. 09/153,617 filed Sep. 15,1998, entitled RFID Interrogator Signal Processing System for Reading Moving Transponder, by Zai et al. The above identified U.S. Patents and U.S. Patent applications are hereby incorporated by reference.

SUMMARY OF THE INVENTION

The paragraph headed "The Solution" at the first page of incorporated Provisional Application Ser. No. 60/070,336 is referenced for further summary information.

A bonding pad for a semiconductor chip surrounded by a mechanical supportive structure is disclosed. The bonding pad may have reduced area and capacitance over prior art bonding pads, while the mechanical supportive structure provides mechanical support to a bonding structure which has metal spread outside the bonding pad area over the insulating passivation material protecting the chip.

The novel structure is useful in leading in high frequency signals into the chip.

The novel structure is particular useful in leading in high frequency signals from an antenna into the chip.

In an illustrative embodiment, a new RFID tag includes an input/output structure for a RFID tag integrated circuit (IC) where pad capacitance is minimized while providing mechanical support for the connection masses or bumps (which are to connect antenna configurations such as shown in the incorporated U.S. Pat. No. 5,528,222, e.g. the second through sixth figures), so that cracking or cratering will not occur during packaging.

BRIEF DESCRIPTION OF THE DRAWINGS

An important aspect of the present invention relates to an RF transponder utilizing for example an RF1D chip such as shown in the second and third figures of U.S. Pat. No. 5,528,222, with input/output pads separated into inner chip circuitry connection pads of relatively small size, and outer pad portions such that the overall size of the composite pad structures are sufficient e.g. for supporting bonding masses to be connected to an antenna or antennas.

DETAILED DESCRIPTION OF THE INVENTION

FIGS. 1–6 show a method for producing the apparatus of the invention as steps for producing the apparatus using methods that are very well known in the semiconductor manufacturing art.

Figure 1:
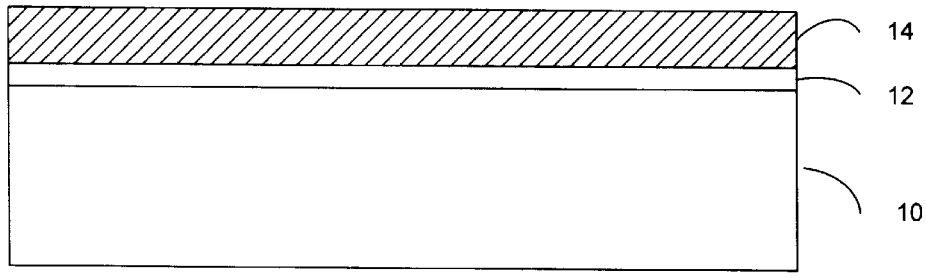
FIG. 1 shows a cross section of a part of a semiconductor wafer or chip at the point in time where the connection pads are normally provided.

FIG. 1 shows a part of a semiconductor wafer or chip at the point where the connection pads are normally provided. The wafer or chip 10 has already completed circuitry and wiring (not shown) to form the integrated circuitry. An insulating layer 12 and an electrically conducting (usually metal, but possibly conducting polymeric material) layer 14 are laid down on the wafer as shown in FIG. 1. The electrically conducting layer 14 is patterned by normal photo resist application, exposure, etching and resist stripping to give the structure shown in elevation in FIG. 2, and in plan view in FIG. 3. In the alternative, the structure shown in FIGS. 2 and 3 could be applied to the surface of a wafer directly by screening a paste to produce the conducting material shown. A bonding pad 20 is substantially surrounded by a mechanical supportive structure 22. A connection line 30 is shown which connects to an element of the integrated circuit (not shown). The connection line 30 would normally connect to the gate of an FET. It is possible but not usual to bring a connection line up directly under the pad 20 and do away with the connection line 30, but it is not usual. The areas of the bonding pad 20 and the mechanical supportive structure 22 are $A_1$ and $A_2$ respectively. The mechanical supportive structure 22 is shown as a broken ring, but may be in the sense of this disclosure any shape which substantially encloses the pad 20. The function of the mechanical supportive structure is to distribute mechanical stresses to avoid cracking of a layer of passivation material (applied later). The mechanical supportive structure allows a smaller bonding pad and hence reduced capacitance. The shape of the mechanical supportive structure is any shape which would avoid cracking of the passivation material. The mechanical supportive structure 22 would normally be of the same material as the pad 20, but may in fact be of some other material which would provide the same function. The mechanical supportive structure may be electrically grounded, or may be left floating, or it may be indeed an insulator.

Figure 2:
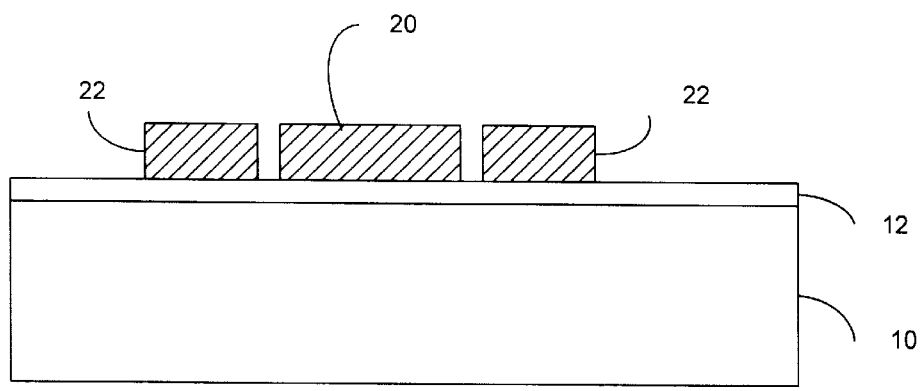
FIG. 2 shows the result of patterning and etching the structure of FIG. 1 in elevation.
Figure 3:
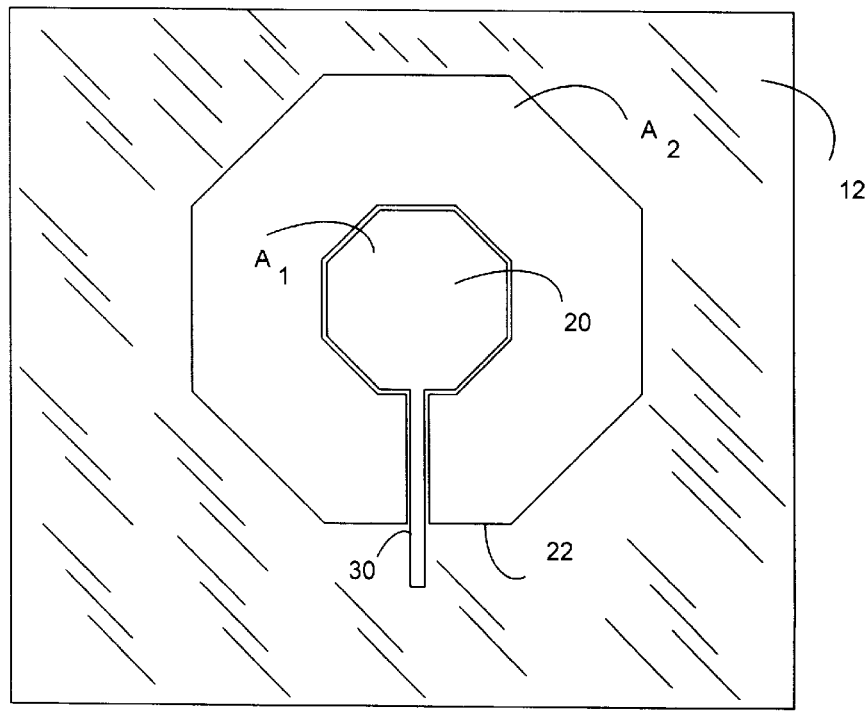
FIG. 3 shows the result of patterning and etching the structure of FIG. 1 in plan view.

An octagonal pad 20 and ring 22 are shown in FIGS. 2 and 3, but it is clear that square, rectangular, hexagonal, round, elliptical, or indeed any other shape of pad may be used. Octagonal, round, or hexagonal bonding pads have less area and hence less capacitance than square or rectangular pads for the same bonding function, however, and are therefore more preferred.

Figure 4:
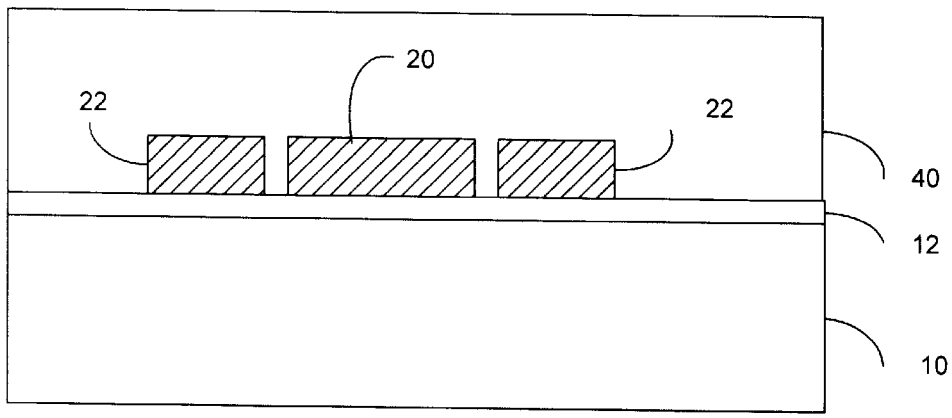
FIG. 4 shows the structure of FIG. 2, with a layer 40 of insulating passivation material (generally SiO$_2$) laid down.

FIG. 4 shows the structure of FIG. 2, with a layer 40 of insulating passivation material (generally SiO$_2$) laid down. The layer 40 thickness may be much thicker than the layer 12 thickness.

Figure 5:
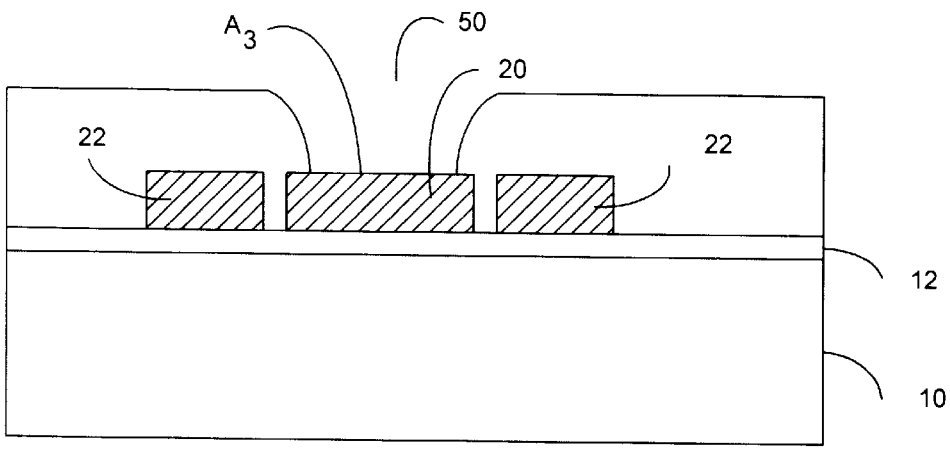
FIG. 5 shows the results of a patterning of layer 40 to open a connection hole to the pad

FIG. 5 shows the results of a patterning of layer 40 to open a connection hole 50 to the pad 20. The area of the pad metal exposed is given by $A_3$, which is less than $A_1$.

Figure 6:
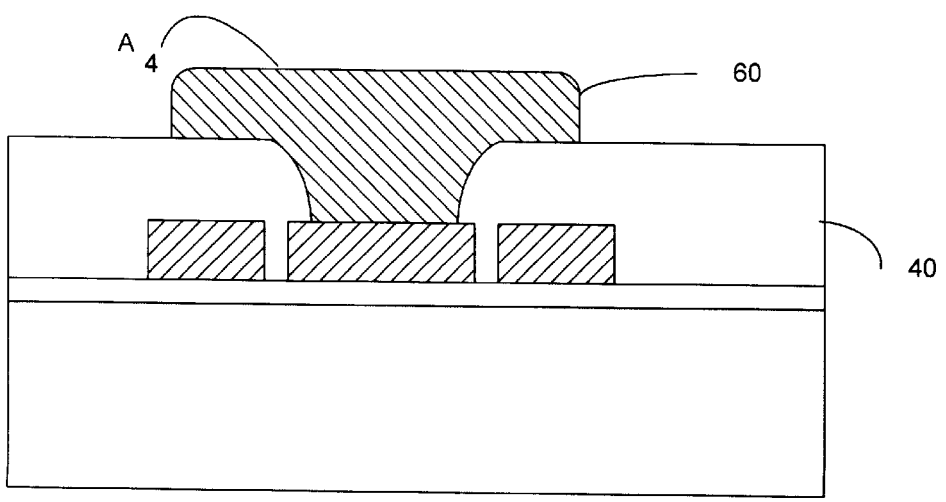
FIG. 6 shows a metal "bump" plated up over the passivation layer.

It is preferable to bond wires directly to the structure of FIG. 5 by various compression bonding methods which use heat, pressure, ultrasonic energy, and/or laser energy. It is more preferred to provide a metal bump on top of pad 20. A metal "bump" 60 is plated up over the passivation layer 40 as shown in FIG. 6. The edges of the bump do not extend past the edges of the mechanical supportive structure 22. The area of the top of the bump is given in this example by $A_4$. When the structure of FIG. 6 without the mechanical supportive structure was bonded by thermal compression bonding, where the metal bump edges extended over the passivation layer 40 past the edges of the pad 20, the passivation layer cracked at the edges of the bump shown in FIG. 6.

The size of the bump in FIG. 6 must be of a certain minimum in order to use conventional bonding tools. The size of the opening in layer 40 is limited by lithography ground rules to be a certain amount smaller than the pad 20.

Prior art pad dimensions of 114 microns with a passivation opening of 74 microns and a bump diameter of 94 microns showed a capacitance of 186 femtofarads (fF). The smallest pads 20 and lowest capacitance we could achieve by prior art methods was 100 microns with a 65 micron opening and a 90 micron diameter bump, which had a capacitance of 144 fF With the method of the invention, we achieved good results with a 60 micron pad, a 50 micron opening, and a 96 micron diameter bump, which exhibited a capacitance of 120 fF. The mechanical supportive structure 22 width was 25 microns, with a spacing between the mechanical supportive structure 22 the pad 20 of 3 micron.

The communication pad structure of FIG. 5 preferably has pad area $A_1$ less than $7.5 \times 10^{-9}$ m$^2$ more preferably less than $5 \times 10^{-9}$ m$^2$, and most preferably less than $3 \times 10^{-9}$ m$^2$.

The communication pad structure of FIG. 5 preferably has an area $A_3$ of the pad exposed less than $5 \times 10^{-9}$ m$^2$, more preferably less than $3 \times 10^{-9}$ m$^2$, and most preferably less than $2 \times 10^{-9}$ m$^2$.

Figure 7:
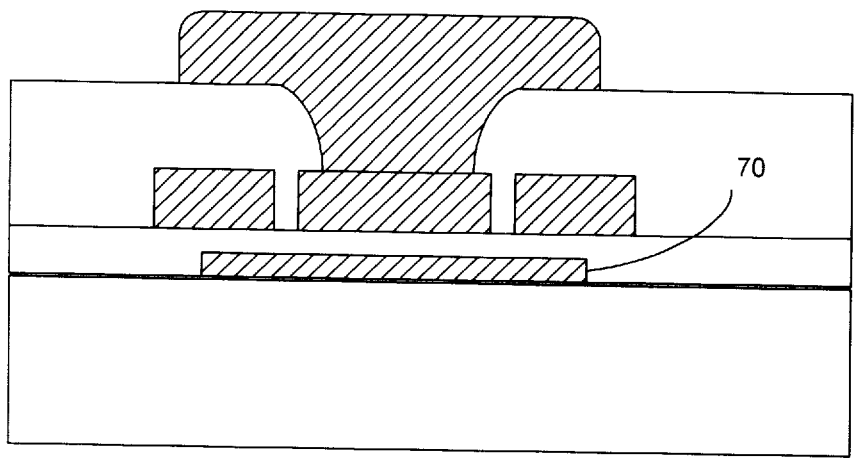
FIG. 7 shows an alternative embodiment of the invention.

FIG. 7 shows an alternative embodiment of the invention, wherein an electrically conducting material 70 is placed under the insulating material under bonding pad 20. The conducting material 70 may be grounded or may be an RF shunt to ground. The input capacitance of the arrangement shown in FIG. 7 is raised over that shown in FIG. 5, but the parasitic resistance to ground which lowers the Q of an RF tag antenna or other antenna is removed.

Figure 8:
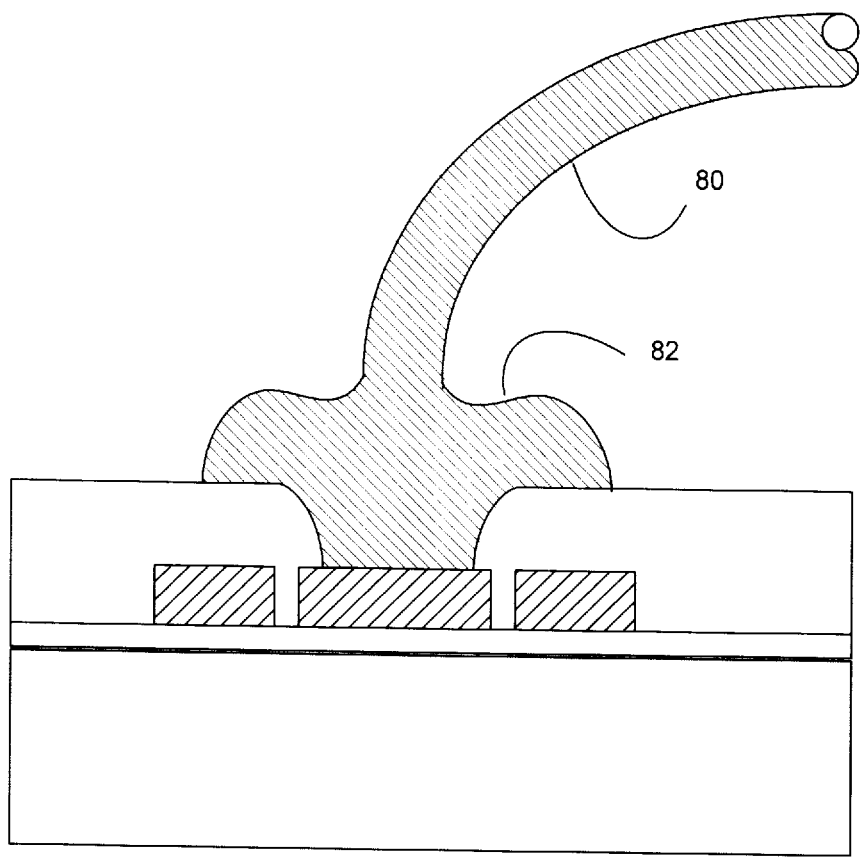
FIG. 8 shows the embodiment of the invention shown in FIG. 5 bonded directly by ball bonding a wire to the pad.

FIG. 8 shows the embodiment of the invention shown in FIG. 5 bonded directly by ball bonding a wire 80 to the pad 20. Note that in FIG. 8, the metal of the wire 8 has been deformed to form a metal bump 82 over mechanical supportive structure 22.

In view of the above disclosure of the present application including the material incorporated herein by reference, many modifications, adaptations, variations and alternative embodiments will be apparent to those skilled in the art and may be effected without departing from the spirit and scope of the present disclosure. It is therefore to be understood that, within the scope of the appended claims, the invention may be practiced otherwise then as specifically described.

We claim:

1. A radio frequency (RF) device, comprising;
   an antenna,
   a semiconductor device connected to the antenna with an electrically conducting lead, wherein the electrically conducting lead is compression bonded to a communication pad structure attached to the semiconductor device, the communication pad structure comprising:
   a first electrically insulating layer having a first side and a second side, the first side attached to a surface of the semiconductor device;
   a second electrically conducting layer having a third side and a fourth side, the third side connected to the second side of the first insulating layer, the electrically conducting layer formed into:
      a pad, the pad for electrically connecting to an active element of the semiconductor device, the pad having a pad area $A_1$;
      a mechanical supportive structure, the mechanical supportive structure substantially surrounding the pad, the mechanical supportive structure having a mechanical supportive structure area $A_2$;
   a third electrically insulating layer having a fifth and a sixth side, the fifth side connected to the second side of the first insulating layer outside the areas $A_1$ and $A_2$ of the pad and the mechanical supportive structure, the third layer effectively covering the area $A_2$ of the mechanical supportive structure, the third layer effectively covering the edges of the pad, the third layer having a contact hole allowing the electrically conducting lead to contact a central portion of the pad, where the area of the pad exposed for contacting is $A_3$.

2. The RF device of claim 1, wherein the RF device is an RF identification transponder.

3. A radio frequency (RF) device, comprising;
   an antenna,
   a semiconductor device bonded to the antenna via
   a communication pad structure attached to the semiconductor device, the communication pad structure comprising:
   an electrically conducting pad electrically connected to an active element of the semiconductor device, the pad having a pad area $A_1$, wherein the electrically conducting pad is electrically insulated by an electrically insulating layer from the semiconductor device over substantially all of the pad area $A_1$;
   a mechanical supportive structure, the mechanical supportive structure substantially surrounding the pad, the mechanical supportive structure having a mechanical supportive structure area $A_2$; and
   an electrically insulating material effectively covering the mechanical supportive structure area $A_2$, the electrically insulating material having a contact hole for bonding the antenna to the electrically conducting pad, where the area of the electrically conducting pad exposed for contacting is $A_3$.

4. The RF device of claim 3, wherein the RF device is an RF identification transponder.

5. The radio frequency (RF) device of claim 3, wherein the pad area $A_1$ is less than $7.5 \times 10^{-9}$ m$^2$.

6. The radio frequency (RF) device of claim 5, wherein the pad area $A_1$ is less than $5 \times 10^{-9}$ m$^2$.

7. The radio frequency (RF) device of claim 6, wherein the pad area $A_1$ is less than $3 \times 10^{-9}$ m$^2$.

8. The radio frequency (RF) device of claim 3, wherein the area of the pad exposed for contacting $A_3$ is less than $5 \times 10^{-9}$ m$^2$.

9. The radio frequency (RF) device of claim 8, wherein the area of the pad exposed for contacting $A_3$ is less than $3 \times 10^{-9}$ m$^2$.

10. The radio frequency (RF) device of claim 9, wherein the area of the pad exposed for contacting $A_3$ is less than $2 \times 10^{-9}$ m$^2$.

11. The radio frequency (RF) device of claim 3, wherein the contact hole is filled with a contact metal, and the contact metal forms a bump which extends over the insulating material to form a bump of area $A_4$, where $A_4$ is greater than $A_1$.

12. The radio frequency (RF) device of claim 3, where $A_4$ is less than $A_1$ plus $A_2$.

13. The radio frequency (RF) device of claim 3, further comprising an electrically conducting layer attached under the electrically conducting pad and insulated from the electrically conducting pad, the electrically conducting layer acting as a radio frequency (RF) shunt to ground.

14. The radio frequency (RF) device of claim 1, wherein the pad area $A_1$ is less than $7.5 \times 10^{-9}$ m$^2$.

15. The radio frequency (RF) device of claim 14, wherein the pad area $A_1$ is less than $5 \times 10^{-9}$ m$^2$.

16. The radio frequency (RF) device of claim 15, wherein the pad area $A_1$ is less than $3 \times 10^{-9}$ m$^2$.

17. The radio frequency (RF) device of claim 13, wherein the area of the pad exposed for contacting $A_3$ is less than $5 \times 10^{-9}$ m$^2$.

18. The radio frequency (RF) device of claim 17, wherein the area of the pad exposed for contacting $A_3$ is less than $3 \times 10^{-9}$ m$^2$.

19. The radio frequency (RF) device of claim 18, wherein the area of the pad exposed for contacting $A_3$ is less than $2 \times 10^{-9}$ m$^2$.

20. The radio frequency (RF) device of claim 13, wherein the contact hole is filled with a contact metal, and the contact metal forms a bump which extends over the insulating material to form a bump of area $A_4$, where $A_4$ is greater than $A_1$.

21. The radio frequency (RF) device of claim 20, where $A_4$ is less than $A_1$ plus $A_2$.

* * * * *